United States Patent
Tsurumoto

(10) Patent No.: US 8,219,948 B2
(45) Date of Patent: Jul. 10, 2012

(54) LAYOUT VERIFICATION DEVICE, LAYOUT VERIFICATION PROGRAM, AND LAYOUT VERIFICATION METHOD OF LAYOUT PATTERN OF SEMICONDUCTOR DEVICE

(75) Inventor: Taketoshi Tsurumoto, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 264 days.

(21) Appl. No.: 12/651,739

(22) Filed: Jan. 4, 2010

(65) Prior Publication Data

US 2010/0175034 A1    Jul. 8, 2010

(30) Foreign Application Priority Data

Jan. 6, 2009   (JP) ................. 2009-000742

(51) Int. Cl.
   *G06F 17/50*    (2006.01)
(52) U.S. Cl. ............ 716/106; 716/51; 716/55; 716/107; 716/111; 716/122
(58) Field of Classification Search .............. 716/51, 716/52, 55, 106, 107, 111, 122, 126
   See application file for complete search history.

(56) References Cited

U.S. PATENT DOCUMENTS

| 5,613,102 A * | 3/1997 | Chiang et al. ............ 716/52 |
| 6,892,367 B2 * | 5/2005 | Palusinski et al. ........ 716/52 |
| 7,561,999 B2 * | 7/2009 | Iwamoto et al. .......... 703/14 |

FOREIGN PATENT DOCUMENTS

JP          11-110542 A      4/1999

* cited by examiner

*Primary Examiner* — Sun Lin
(74) *Attorney, Agent, or Firm* — Sughrue Mion, PLLC

(57) ABSTRACT

A layout verification device according to the present invention includes a layout verification unit that outputs a first error graphic corresponding to an area where there is an inconsistency with a design rule in a first layout pattern, and includes a target error graphic setting unit that sets a processing target area including the first error graphic, an error graphic search unit that searches a second error graphic included in a processing target area of a second layout pattern where verification by the layout verification unit has already been performed, and an error graphic equivalence judgment unit that judges that the first error graphic and the second error graphic are non-equivalent when a second target vertex coordinate of the second error graphic does not match any one of a plurality of peripheral vertex coordinates set in grid intersections adjacent to the first target vertex coordinate of the first error graphic.

13 Claims, 14 Drawing Sheets

LAYOUT VERIFICATION DEVICE, LAYOUT VERIFICATION PROGRAM, AND LAYOUT VERIFICATION METHOD OF LAYOUT PATTERN OF SEMICONDUCTOR DEVICE

INCORPORATION BY REFERENCE

This application is based upon and claims the benefit of priority from Japanese patent application No. 2009-000742, filed on Jan. 6, 2009, the disclosure of which is incorporated herein in its entirety by reference.

BACKGROUND

1. Field of the Invention

The present invention relates to a layout verification device, a layout verification program, and a layout verification method of a layout pattern of a semiconductor device, and more specifically, to a layout verification device, a layout verification program, and a layout verification method to judge validity of an error graphic output in a design rule check (DRC).

2. Description of Related Art

In a layout process of a semiconductor device, graphic shape is corrected, deleted, or added based on layout data that is previously designed in order to effectively perform layout design. In this layout design, DRC (Design Rule Check) is performed to check whether the graphic shape of the layout data that is once completed satisfies the design rule. The design rule is a standard (hereinafter referred to as design standard) to prevent malfunction that occurs in a manufacturing process. In designing the semiconductor device, the layout pattern needs to be created according to the design rule. When the error is detected as a result of DRC verification, this error is analyzed. At this time, if the correction is performed based on the layout data that is previously designed, two kinds of errors including a real error and a pseudo error are detected in the DRC verification. The real error is the error in which the layout pattern needs to be corrected, and the pseudo error is the error that is generated by calculation error or the like of the DRC verification and correction of the layout pattern is not needed for the pseudo error. It is desired to remove the pseudo error from the error that is output to extract only the real error in order to effectively analyze the verification result of the DRC verification.

In the DRC verification, the graphic showing the area that does not meet the design rule is output as the error graphic. As such, it is effective to remove the error graphic whose shape is equal to that of the error which is previously judged as the pseudo error by the graphic processing from error target in order to remove the pseudo error. One of the methods of graphic processing includes graphic shape comparison processing (Layout Versus Layout, hereinafter abbreviated as LVL). In the LVL, the error is judged as pseudo error if the error graphic shape that is detected in the layout data after correction completely matches the error graphic shape that is detected in the previous layout data.

However, even in the DRC verification that is performed on the same layout pattern, different error graphics may be output. Whereas a distance between patterns is calculated regardless of grid unit in the DRC verification, vertices of the graphic are arranged in grid intersections in the layout pattern and the error graphic. As such, when the error graphic including vertices in the grid intersections is created based on the error area created in the DRC verification, different error graphics may be created for the same error area due to occurrence of a rounding error or the like of calculation in shifting the vertex. Thus, the pseudo error cannot be removed only with the judgment of match or mismatch of the error graphics by LVL. A method of judging the equivalence of the graphic is disclosed in Japanese Unexamined Patent Application Publication No. 11-110542.

FIG. 19 shows a block diagram of a pattern extracting device 100 disclosed in Japanese Unexamined Patent Application Publication No. 11-110542. The pattern extracting device 100 will now be described. FIG. 20 shows one example of a graphic pattern processed in the pattern extracting device 100. First, the pattern extracting device 100 judges whether there is a first pattern X in a second pattern Y, and when there is a first pattern X, an area corresponding to the first pattern X is extracted from the second pattern Y. Now, the pattern extracting device 100 includes a feature point extraction unit 110, a feature amount extraction unit 111, a similarity calculation unit 112, a corresponding candidate point setting unit 113, a correspondence determination unit 114, and a corresponding point extraction unit 115. Note that an input means 101 includes a keyboard that inputs data to the pattern extracting device 100, a mouse, a storage device, and means for reading data from network. An output means 102 includes a display that displays the extraction result by the pattern extracting device 100, a printer, and other output means.

The feature point extraction unit 110 arranges feature points on each of the first pattern X and the second pattern Y. The feature amount extraction unit 111 extracts the feature amount from peripheral pattern information of the feature points for each feature point arranged by the feature point extraction unit 110. The similarity calculation unit 112 compares the feature amount of the first pattern X with that of the second pattern Y to obtain similarity of the feature point of the first pattern X and the feature point of the second pattern Y. The corresponding candidate point setting unit 113 obtains a plurality of corresponding candidate points $P(i;1)$ to $P(i;3)$ on the second pattern Y that may correspond to the feature point on the first pattern X based on the similarity between the feature points. The correspondence determination unit 114 repeatedly calculates the correspondence of each of the corresponding candidate points $P(i;1)$ to $P(i;3)$ using the similarity calculated by the similarity calculation unit 112, a distance dx between any feature point i on the first pattern X and a neighboring feature point u with a center of the feature point i, and a distance dy between the corresponding candidate points $P(i;1)$ to $P(i;3)$ of the feature point i and a corresponding candidate point k2 of the neighboring feature point u of the feature point i. The corresponding point extraction unit 115 extracts the corresponding candidate points $P(i;1)$ to $P(i;3)$ having high correspondence.

In the pattern extracting device 100, the feature point and the corresponding feature point are extracted, and the distance between the feature point and the corresponding candidate point is calculated, so as to judge similarity of the graphics. Then, similarity of the graphics is judged when the graphic is rotated or shifted in parallel by the judgment of similarity.

SUMMARY

However, in the pattern extracting device 100, the feature point and the corresponding candidate point need to be extracted for each of the two graphics to calculate the distance thereof. Thus, according to the pattern extracting device 100, calculation time required to judge similarity of the graphics increases.

A first exemplary aspect of an embodiment of the present invention is a layout verification device that includes a layout verification unit, the layout verification unit verifying consistency of a first layout pattern where vertices are arranged along with grid intersections and a design rule and outputting a first error graphic corresponding to a position judged as inconsistent, the layout verification device including a target error graphic setting unit that specifies location of the first error graphic in the first layout pattern, and sets a processing target area including the first error graphic, an error graphic search unit that searches a second error graphic located in an area corresponding to the processing target area of a second layout pattern where verification by the layout verification unit has already been performed, and an error graphic equivalence judgment unit that compares a plurality of vertex coordinates of the first error graphic with a plurality of vertex coordinates of the second error graphic to verify equivalence of the second error graphic and the first error graphic, in which the error graphic equivalence judgment unit sets vertices having different coordinates between the first error graphic and the second error graphic as a first target vertex coordinate and a second target vertex coordinate, respectively, and judges that the first error graphic and the second error graphic are non-equivalent when the second target vertex coordinate does not match any one of a plurality of peripheral vertex coordinates set in grid intersections that are adjacent to the first target vertex coordinate.

A second exemplary aspect of an embodiment of the present invention is a layout verification program that is executed in a calculation circuit and verifies equivalence of a first error graphic and a second error graphic, the first error graphic being obtained by verifying consistency of a first layout pattern where vertices are arranged along with grid intersections and a design rule, the second error graphic being obtained from a second layout pattern where layout verification has already been performed, the program including reading the first error graphic from a storage device, setting a processing target area including the first error graphic, reading the second error graphic from the storage device, searching a second error graphic located in an area corresponding to the processing target area of the second error graphic, and setting vertices having different coordinates between the first error graphic and the second error graphic as a first target vertex coordinate and a second target vertex coordinate, respectively, and performing equivalence judgment of graphics by judging that the first error graphic and the second error graphic are non-equivalent when the second target vertex coordinate does not match any one of a plurality of peripheral vertex coordinates set in grid intersections that are adjacent to the first target vertex coordinate.

A third exemplary aspect of an embodiment of the present invention is a layout verification method that verifies equivalence of a first error graphic and a second error graphic, the first error graphic being obtained by verifying consistency of a first layout pattern where vertices are arranged along with grid intersections and a design rule, the second error graphic being obtained from a second layout pattern where layout verification has already been performed, the method including setting a processing target area including the first error graphic, searching a second error graphic that is located in an area corresponding to the processing target area of the second error graphic, setting vertices having different coordinates between the first error graphic and the second error graphic as a first target vertex coordinate and a second target vertex coordinate, respectively, and performing equivalence judgment of graphics by judging that the first error graphic and the second error graphic are non-equivalent when the second target vertex coordinate does not match any one of a plurality of peripheral vertex coordinates set in grid intersections that are adjacent to the first target vertex coordinate.

According to the layout verification device, the layout verification program, and the layout verification method of the present invention, equivalence of two graphics is judged by judging match or mismatch of the second target vertex coordinate located on the grid intersection and the peripheral vertex coordinates that are set based on the first target vertex coordinate. Accordingly, in the layout verification device, the layout verification program, and the layout verification method of the present invention, there is no need to perform calculation which requires large amount of time such as the processing of calculating the distance between vertices to judge equivalence of the graphics. Thus, equivalence of the graphics can be judged in short time.

According to the layout verification device, the layout verification program, and the layout verification method of the present invention, equivalence of the graphics can be judged in short time.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Hereinafter, the exemplary embodiments of the present invention will be described with reference to the drawings. A layout verification method according to the first exemplary embodiment may be realized as a hardware (layout verification device), or may be realized as a software (layout verification program) that operates on a calculation circuit such as a CPU (Central Processing Unit) or the like. In the following description, the layout verification method will be described first, and thereafter a method of realizing the layout verification method according to the first exemplary embodiment in the hardware or the software will be described.

Further, the layout verification method according to the first exemplary embodiment is employed in order to remove a pseudo error that is already verified among pseudo errors included in an error graphic output in a DRC (Design Rule Check) verification process included in a layout process. Thus, in the layout process that is performed in the following description, a first layout pattern (hereinafter referred to as corrected layout pattern) is generated by correcting a second layout pattern on which DRC verification has already been performed (hereinafter referred to as existing layout pattern).

Figure 1:
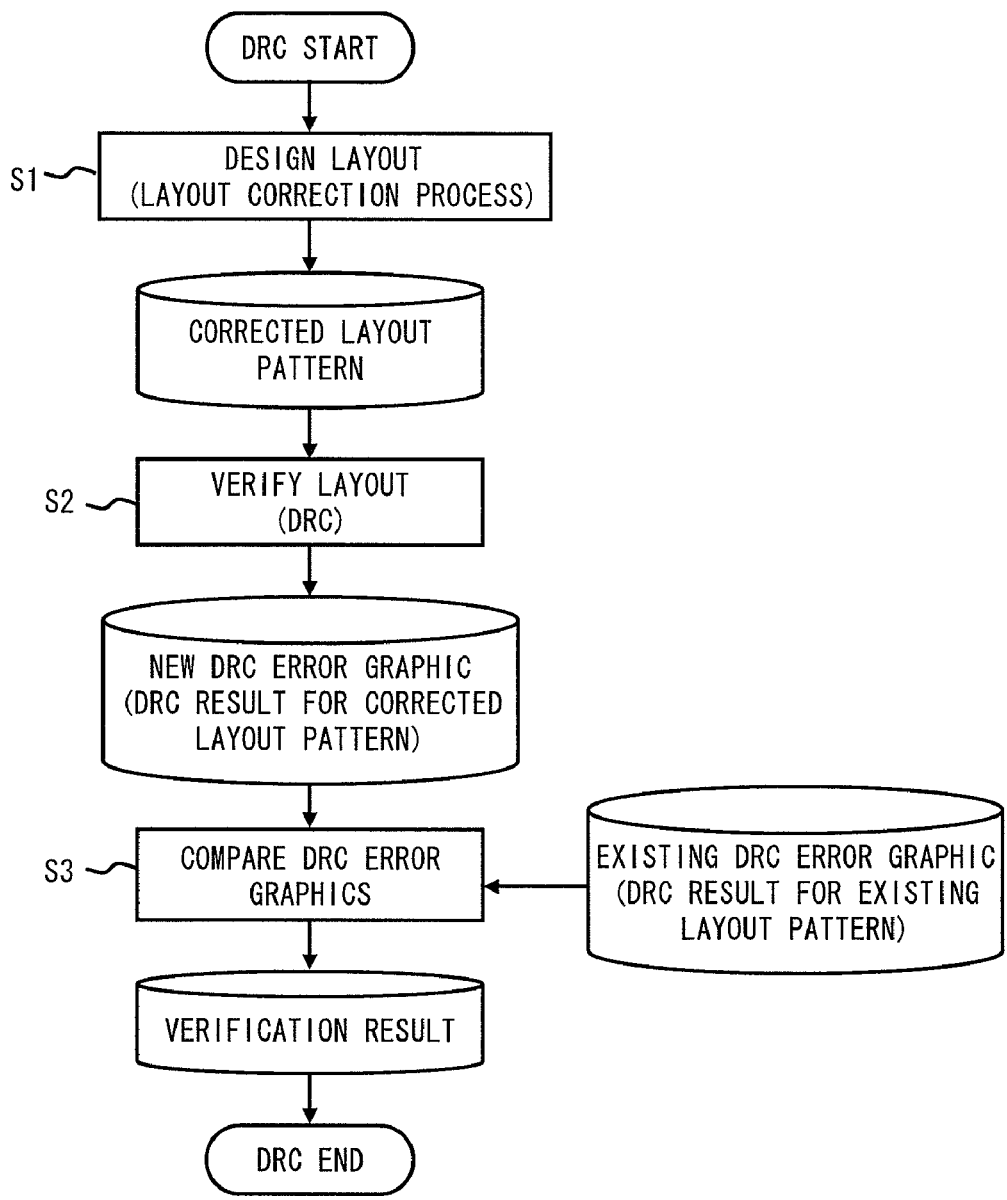
FIG. 1 is a flow chart showing whole processing of a layout verification method according to a first exemplary embodiment.

FIG. 1 shows an overall flow of the layout verification method according to the first exemplary embodiment. As shown in FIG. 1, according to the layout verification method of the first exemplary embodiment, layout design is firstly performed to generate a corrected layout pattern (step S1). In this layout design, existing layout pattern is corrected to generate the corrected layout pattern. Further, in the existing layout pattern and the corrected layout pattern, patterns are arranged along with grids that are arranged with certain intervals, and vertices of the patterns are arranged in the grid intersections.

Subsequently, layout verification is performed on the corrected layout pattern (step S2). In this layout verification, DRC is performed. Then, the result of the layout verification is output as a first error graphic (hereinafter referred to as new DRC error graphic).

Next, DRC error graphics are compared, and a final verification result is output based on this comparison result (step S3). In step S3, equivalence between the new DRC error graphic and the second error graphic (hereinafter referred to as existing DRC error graphic) is judged by comparing the graphics, and the verification result including only the new DRC error graphic which is not equivalent to the existing DRC error graphic is output. The processing in this step S3 is one of the characteristic parts in the first exemplary embodiment, and this processing of step S3 will be described hereinafter in detail.

Figure 2:
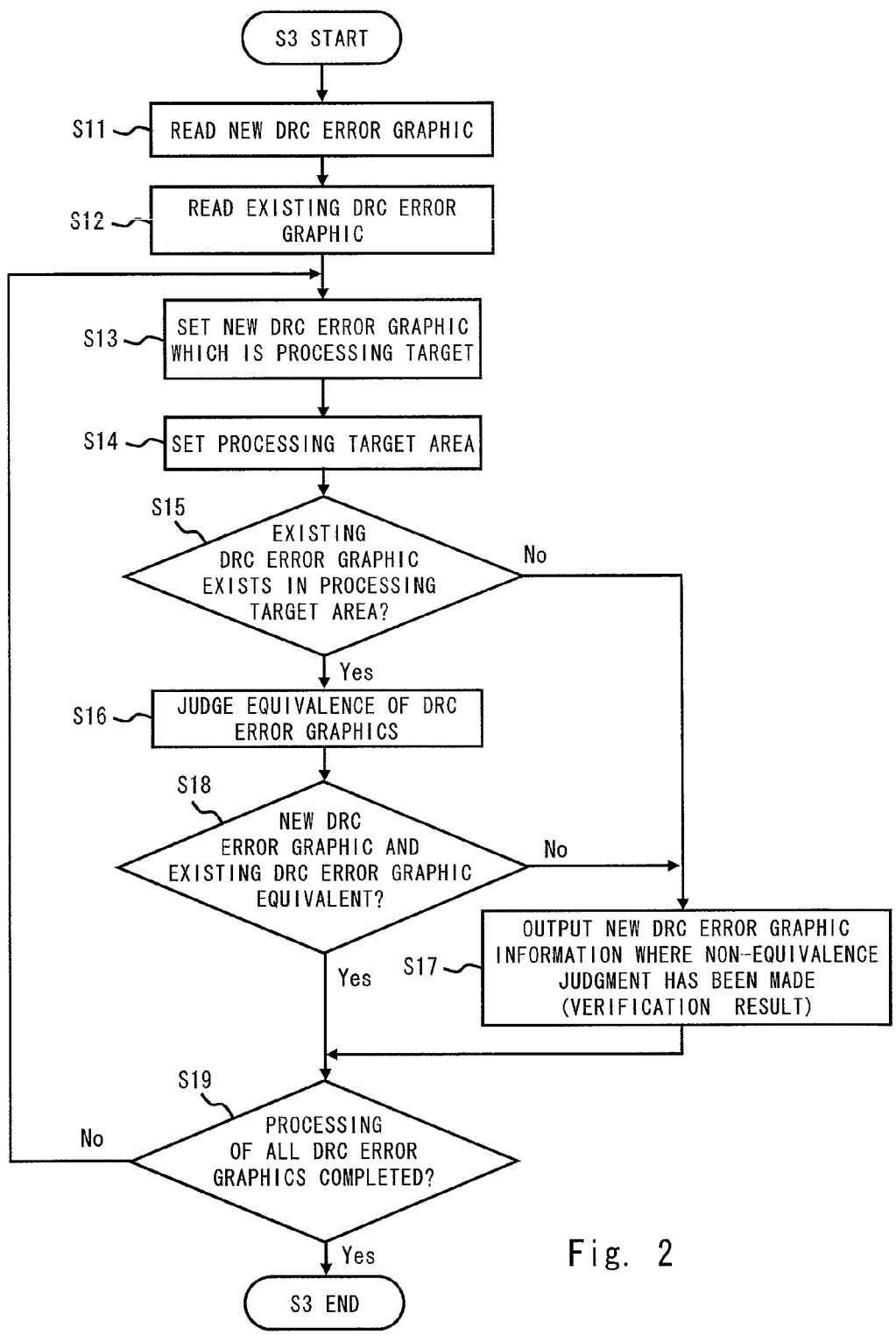
FIG. 2 is a flow chart showing graphic comparison processing according to the first exemplary embodiment.

FIG. 2 shows a flow chart showing detailed processing of graphic comparison processing (step S3). As shown in FIG. 2, according to the graphic comparison processing in the first exemplary embodiment, the new DRC error graphic and the existing DRC error graphic are firstly read (steps S11, S12). Then, the new DRC error graphic which will be the processing target is set (step S13). More specifically, in step S13, the new DRC error graphic which will be the processing target is selected from a plurality of new DRC error graphics. Subsequently, the processing target area including the new DRC error graphic is set (step S14). More specifically, in step S14, the position of the new DRC error graphic selected as the processing target on the corrected layout pattern is specified, so as to set the processing target area including the new DRC error graphic.

Subsequently, the existing DRC error graphic included in the processing target area set in step S14 is searched (step S15). When there is no existing DRC error graphic included in the processing target area in step S15, the new DRC error graphic which is the current processing target is judged as non-equivalent, and the new DRC error graphic is output as the verification result (step S17). Meanwhile, when there is existing DRC error graphic included in the processing target area in step S15, equivalence between the new DRC error graphic which is the processing target and the existing DRC error graphic searched in step S15 is judged (step S16).

When the new DRC error graphic and the existing DRC error graphic are judged as equivalent in step S16, it is judged whether there is another new DRC error graphic (steps S18, S19). Further, when the new DRC error graphic and the existing DRC error graphic are judged as non-equivalent in step S16, the new DRC error graphic is output as the verification result (steps S18, S17). Upon completion of the processing of step S17, it is judged whether there is another new DRC error graphic (step S19). When it is judged that there is another new DRC error graphic where equivalence has not been judged in step S19, the flow goes back to step S13. When equivalence of all the new DRC error graphics is judged, the graphic comparison processing of step S3 is completed.

Figure 3:
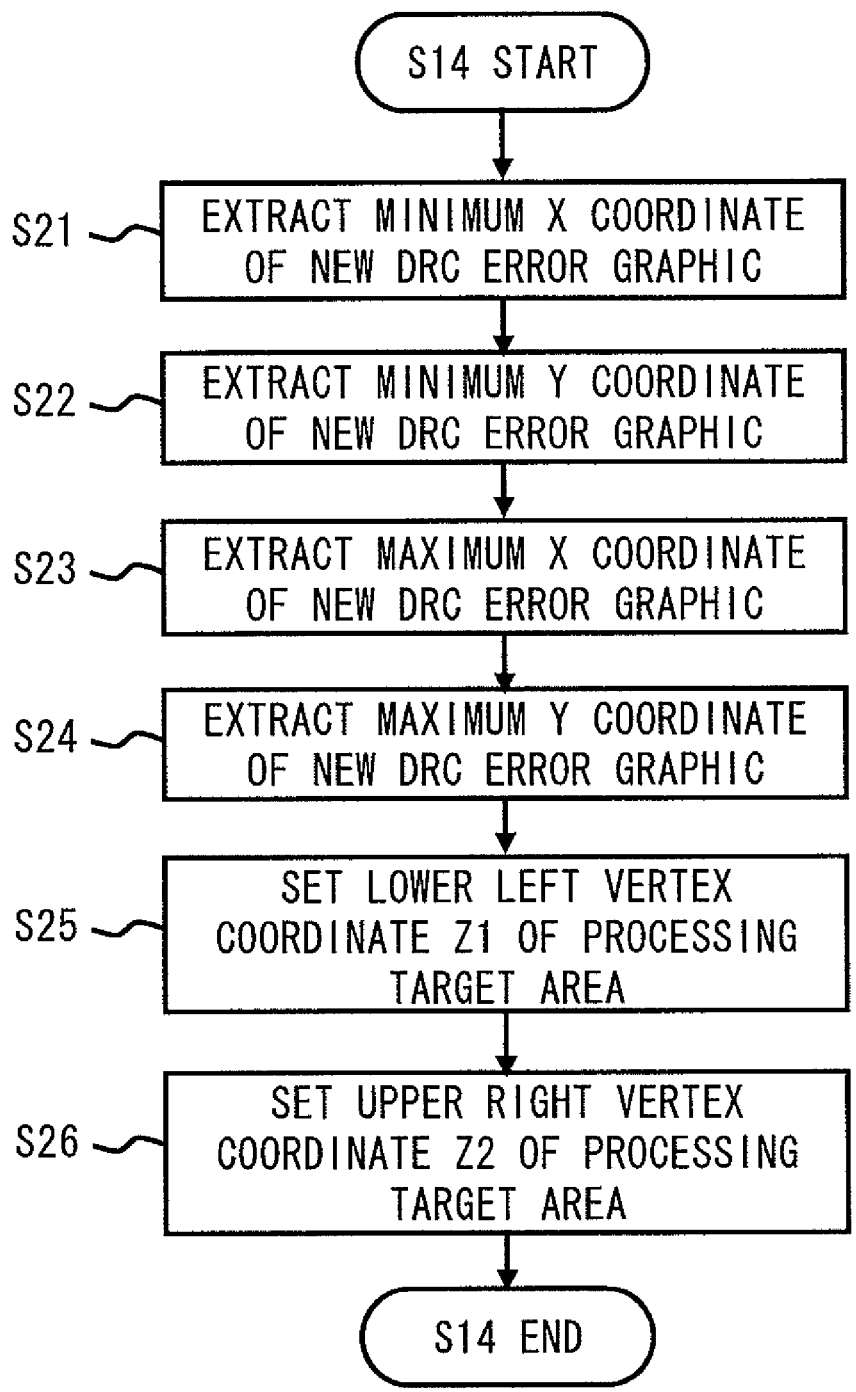
FIG. 3 is a flow chart showing processing of setting a processing target area according to the first exemplary embodiment.

Now, the procedure of setting the processing target area of step S14 and the equivalence judgment procedure of the DRC error graphics of step S16 shown in FIG. 2 will be described further in detail. First, FIG. 3 shows a flow chart showing the procedure of setting the processing target area. As shown in FIG. 3, when the certain target area is set, minimum X coordinate, minimum Y coordinate, maximum X coordinate, and maximum Y coordinate of the new DRC error graphic are extracted (steps S21 to S24). According to the processing of steps S21 to S24, the maximum contour of the new DRC error graphic is calculated. Then, the area including the maximum contour of the new DRC error graphic calculated by the processing of steps S21 to S24 is set to the processing target area. At this time, in the first exemplary embodiment, two points of lower left vertex coordinate Z1 and upper right vertex coordinate Z2 of the processing target area are set so as to define the processing target area (steps S25, S26).

Figure 4:
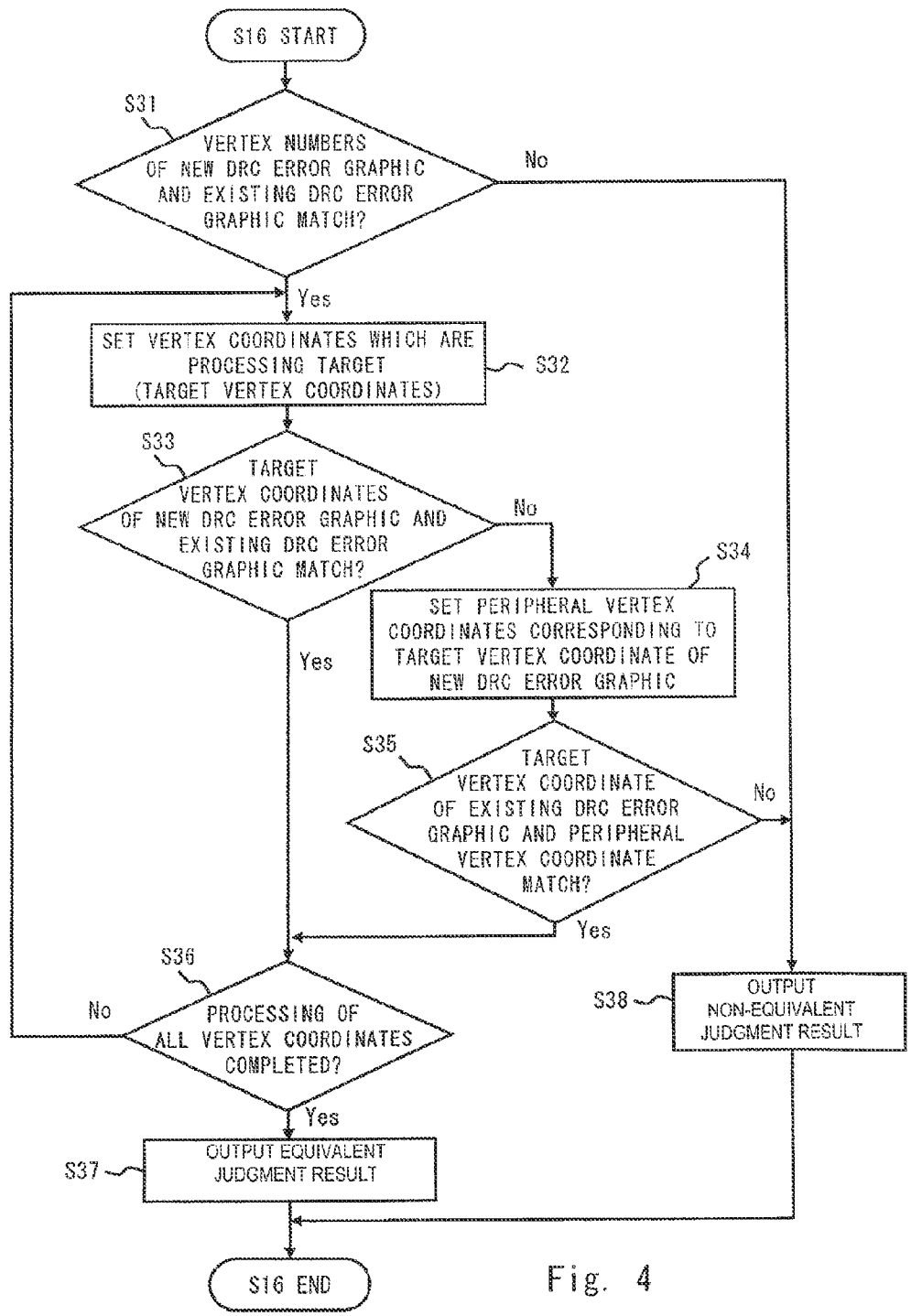
FIG. 4 is a flow chart showing processing of equivalence judgment of graphics according to the first exemplary embodiment.

Next, FIG. 4 shows a flow chart showing procedure of equivalence judgment of the DRC error graphics. As shown in FIG. 4, in the comparison processing of the DRC error graphics, the number of vertices of the new DRC error graphic and that of the existing DRC error graphic are firstly compared (step S31). When they do not match (No in step S31), it is judged that the new DRC error graphic and the existing DRC error graphic are non-equivalent, and the non-equivalent judgment result is output (step S38), thereafter the processing is terminated. Meanwhile, when they match (Yes in step S31), the new DRC error graphic and the existing DRC error graphic may be equivalent, and thus the flow proceeds to step S32. In step S32, the vertex coordinates of the new DRC error graphic and the existing DRC error graphic are read, a pair of vertex coordinates that will be the processing target is selected, and the pair of vertex coordinates that are selected are set as the target vertex coordinates. Note that, the target vertex coordinate corresponding to the new DRC error graphic corresponds to a first target vertex coordinate, and the target vertex coordinate corresponding to the existing DRC error graphic corresponds to a second target vertex coordinate.

Subsequently, in step S33, the target vertex coordinate of the new DRC error graphic and that of the existing DRC error graphic are compared to verify whether the two target vertex coordinates match. When it is judged in step S33 that the two target vertex coordinates match (Yes in step S33), the flow goes to step S36. On the other hand, when it is judged in step S33 that the two target vertex coordinates do not match (No in step S33), the flow goes to step S34.

In step S34, the peripheral vertex coordinates that correspond to the target vertex coordinate of the new DRC error graphic is set. More specifically, the peripheral vertex coordinate is set in each of eight grid intersections that are closest among the neighboring grid intersections with a center of the target vertex coordinate of the new DRC error graphic. Then, it is judged whether there is a peripheral vertex coordinate that matches the target vertex coordinate of the existing DRC error graphic (step S35). When there is a peripheral vertex coordinate that matches the target vertex coordinate of the existing DRC error graphic (Yes in step S35), the flow goes to step S36. Meanwhile, when there is no peripheral vertex coordinate that matches the target vertex coordinate of the existing DRC error graphic (No in step S35), it is judged that the new DRC error graphic which is the processing target and the existing DRC error graphic are non-equivalent to output the non-equivalent judgment result (step S38), thereafter the processing is terminated.

In step S36, it is judged whether the processing of steps S32 to S35 is completed for all the vertex coordinates of the new DRC error graphic which is the processing target. When it is judged in step S36 that there is a vertex coordinate which is not processed (No in step S36), the processing of steps S32 to S35 is executed on the vertex coordinate that is not processed yet. Meanwhile, when it is judged in step S36 that all the vertex coordinates have been processed (Yes in step S36), it is judged that the new DRC error graphic which is the processing target and the existing DRC error graphic are equivalent to output the equivalence judgment result (step S37), thereafter the processing is terminated.

As described above, in the layout verification method according to the first exemplary embodiment, vertex coordinates that are different between the new DRC error graphic and the existing DRC error graphic are used for judging the equivalence. When the difference of the vertex coordinates that are different between the new DRC error graphic and the existing DRC error graphic is one grid intersection or less, it is judged that the new DRC error graphic is equivalent to the existing DRC error graphic to remove the new DRC error graphic from the verification result. In the following description, the layout verification method according to the first exemplary embodiment which is described above will be described with some specific examples.

Figure 5:
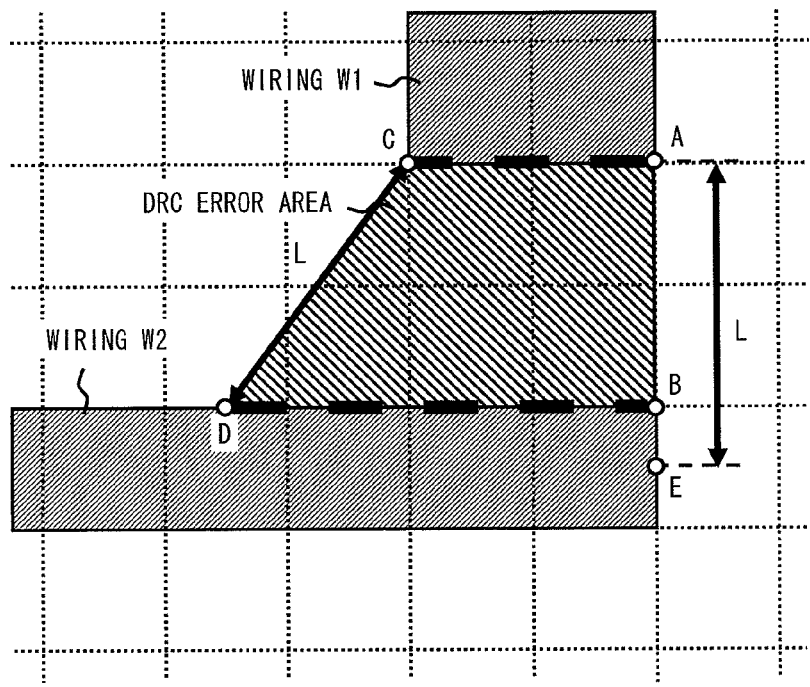
FIG. 5 is a diagram showing one example of a layout pattern processed by applying the layout verification method according to the first exemplary embodiment.

First, FIG. 5 shows an example of the layout pattern which is the target of layout verification. The layout pattern example shown in FIG. 5 shows a partial layout pattern included in the layout pattern of one chip. In the layout pattern example shown in FIG. 5, wirings W1, W2 are arranged. The wirings W1, W2 are arranged along with grid lines (dashed lines in FIG. 5), and the vertices of the pattern are arranged in the grid intersections. For such a layout pattern, in the layout verification shown in step S2 of FIG. 1, it is judged whether the inter-wiring distance between the wiring W1 and the wiring W2 is equal to or more than minimum wiring interval (distance L in the first exemplary embodiment) defined in the design rule. For example, the distance between a side of the wiring W1 and that of the wiring W2 that is opposed to the wiring W1 is measured. At this time, according to the first exemplary embodiment, it is measured if there is a point in a side of the wiring W2 that the distance from the vertices A and C of the wiring W1 is equal to the distance L. In the example shown in FIG. 5, the distance from a point E on the side of the wiring W2 to the vertex A is equal to the distance L. Further, the distance from a point D on the side of the wiring W2 to the vertex C is also equal to the distance L. At this time, it is judged in the layout verification that the side AC of the wiring W1 and the side BD of the wiring W2 do not satisfy the design rule, and the area ACDB is judged as the error area.

Next, the error graphic output as a result of layout verification performed on the layout pattern example shown in FIG. 5 will be described. While the vertex A, the vertex C, and the vertex B are located in the grid intersections in the error area shown in FIG. 5, the vertex D is at the location deviated from the grid intersection. Thus, the error graphic obtained by shifting the vertex D to the grid intersection is created in outputting the error graphic in the layout verification. In the layout verification, it is calculated to which grid intersection the vertex located at the position deviated from the grid intersection should be shifted. At this time, different error graphics may be output for the same error area due to a rounding error of calculation or difference of a calculation order.

Figure 6:
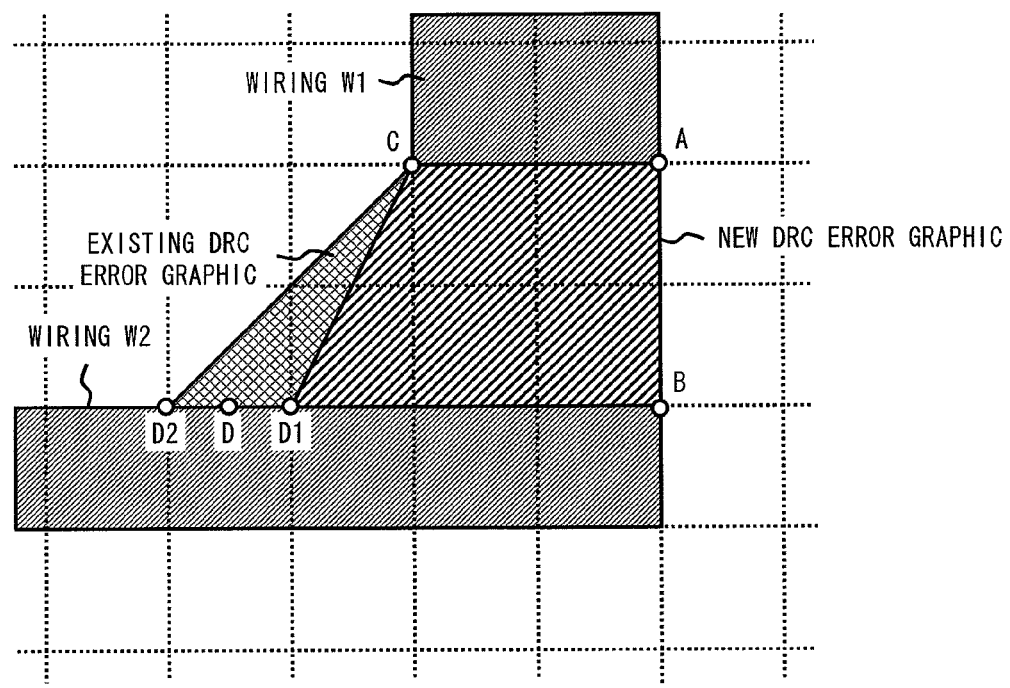
FIG. 6 is a diagram showing an example of a DRC error graphic output as a result of performing layout verification on the example of the layout pattern shown in FIG. 5.

Now, FIG. 6 shows a different error graphic output for the same error area as a result of layout verification performed on the layout pattern example shown in FIG. 5. As shown in FIG. 6, the vertices of the existing DRC error graphic are A, B, D2, and C. On the other hand, the vertices of the new DRC error graphic are A, B, D1, and C. In the first exemplary embodiment, the equivalence of the different error graphics output for the same error area is judged by the graphic comparison processing of step S3 shown in FIG. 1.

Subsequently, the processing of step S3 (FIG. 2) performed on the example of the error graphics shown in FIG. 6 will be described. In step S3, the new DRC error graphic (ABD1C of FIG. 6) and the existing DRC error graphic (ABD2C of FIG. 6) are firstly read in steps S11 and S12. Subsequently, in step S13, for example, the new DRC error graphic shown in FIG. 6 is selected as the graphic of the processing target.

Figure 7:
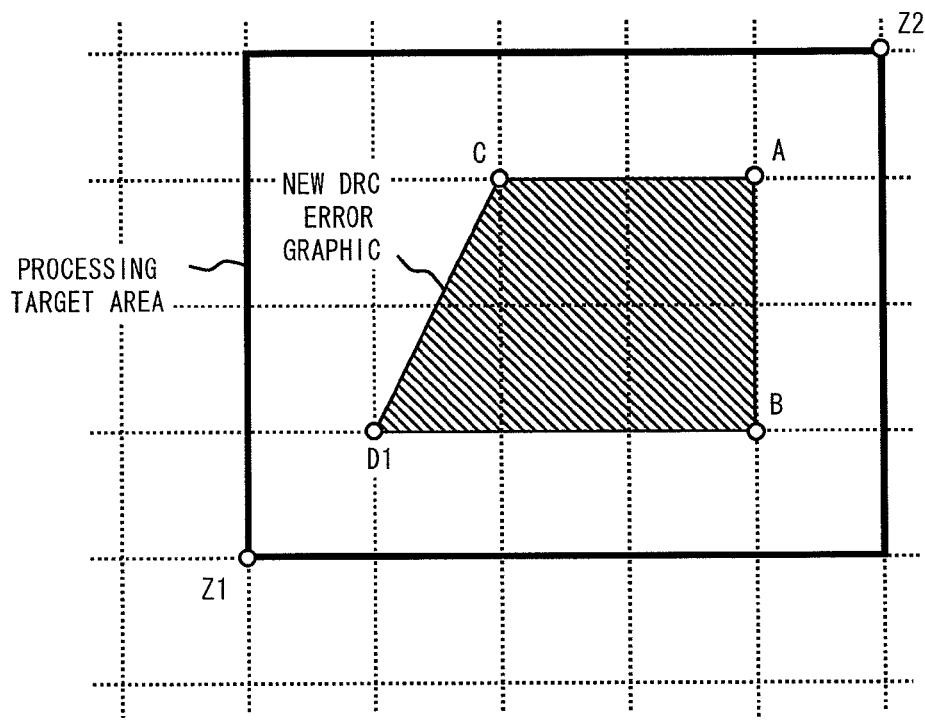
FIG. 7 is a schematic diagram of a processing target area set for a new DRC error graphic shown in FIG. 6.

Then, in step S14 (and steps S21 to S26 shown in FIG. 3), the processing target area is set. FIG. 7 shows a schematic diagram of the processing target area that is set. As shown in FIG. 7, the processing target area is set as an area that is larger than the new DRC error graphic. More specifically, a vertex Z1 is set at the grid intersection that is adjacent to the vertex D1 whose X coordinate and Y coordinate are minimum in an oblique direction, and a vertex Z2 is set at the grid intersection that is adjacent to the vertex A whose X coordinate and Y coordinate are maximum in an oblique direction. Then, the processing target area is set as a basis of the vertices Z1 and Z2. Subsequently, in step S15, the existing DRC error graphic shown in FIG. 6 is searched as the existing DRC error graphic included in the processing target area shown in FIG. 7. Then, the flow goes to step S16 to perform equivalence judgment of the new DRC error graphic and the existing DRC error graphic.

In step S16 (processing shown in FIG. 4), the number of vertices of the new DRC error graphic and that of the existing DRC error graphic are compared in step S31. The new DRC error graphic and the existing DRC error graphic shown in FIG. 6 both include four vertices. Thus, it is judged that the number of vertices of the new DRC error graphic matches that of the existing DRC error graphic shown in FIG. 6, and the flow proceeds to step S32. Subsequently, the target vertex coordinate of the new DRC error graphic which is the processing target is set in step S32. In the first exemplary embodiment, steps S32 to S35 are repeatedly performed from the vertex A to the vertex D1 in series. In the first processing cycle, the vertex A of the new DRC error graphic is set to the target vertex coordinate. In this case, as there is a vertex A of the existing DRC error graphic having the same coordinate as the vertex A of the new DRC error graphic, it is judged that the target vertex coordinates match in step S33 for the first cycle, and the processing passes through step S36 to go back to step S32. The processing of steps S32, S33, and S36 is performed on the vertices B and C of the new DRC error graphic in a similar way as the vertex A.

Figure 8:
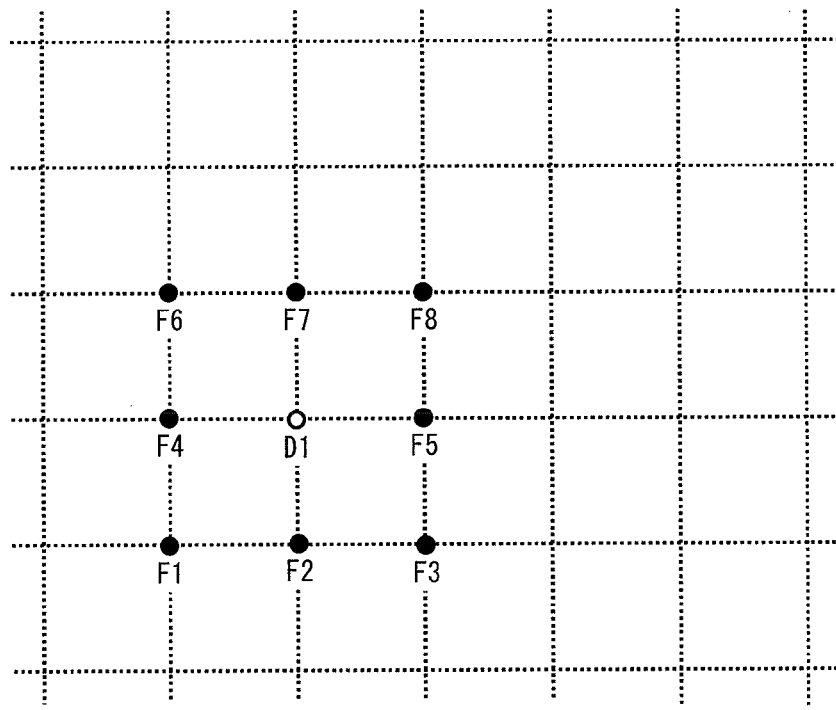
FIG. 8 is a schematic diagram of peripheral vertex coordinates set for a new DRC error graphic shown in FIG. 6.

Subsequently, the vertex D1 of the new DRC error graphic is selected as the target vertex coordinate in step S32, and the coordinate of the vertex D1 and that of the vertex D2 corresponding to the vertex D1 are compared in step S33. At this time, as the coordinate of the vertex D1 and that of the vertex D2 are different, the flow proceeds to step S34. In step S34, the peripheral vertex coordinates corresponding to the vertex D1 are set. Now, FIG. 8 shows a schematic diagram of the peripheral vertex coordinates set in step S34. As shown in FIG. 8, the peripheral vertex coordinates are set on the eight grid intersections that are closest to the vertex D1 among the grid intersections around the vertex D1. Note that, in the following description, the peripheral vertex coordinates that are set are called F1 to F8.

Figure 9:
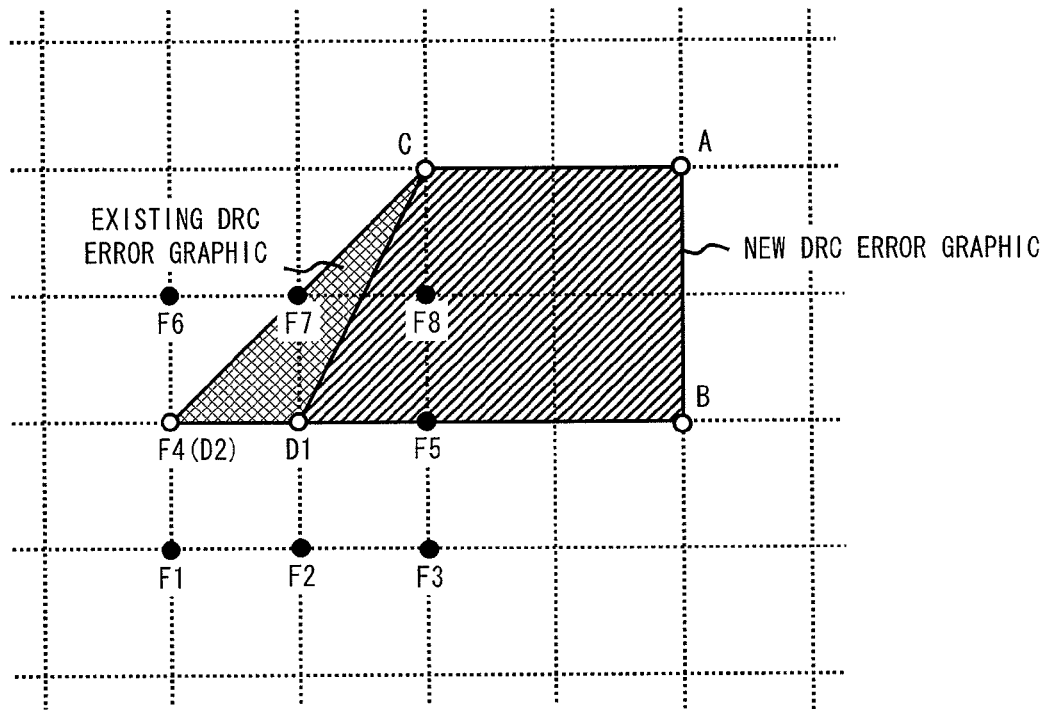
FIG. 9 is a diagram showing a relation between the peripheral vertex coordinates, and the existing DRC error graphic and the new DRC error graphic shown in FIG. 6.

Thereafter, in step S35, the peripheral vertex coordinates and the target vertex coordinate of the existing DRC error graphic are compared. FIG. 9 shows a schematic diagram of this comparison processing. As shown in FIG. 9, in the first exemplary embodiment, the vertex D2 of the existing DRC error graphic matches the peripheral vertex coordinate F4. In other words, it is understood that the new DRC error graphic matches the existing DRC error graphic if the vertex D2 of the new DRC error graphic is deviated by one grid. Thus, the next processing is step S36, where it is judged whether all the vertices A to D1 are processed. Upon judgment that all the vertices are processed, the equivalence judgment result indicating that the error graphics that are the processing target are equivalent is output (step S37), and the processing of step S16 is completed.

Figure 10:
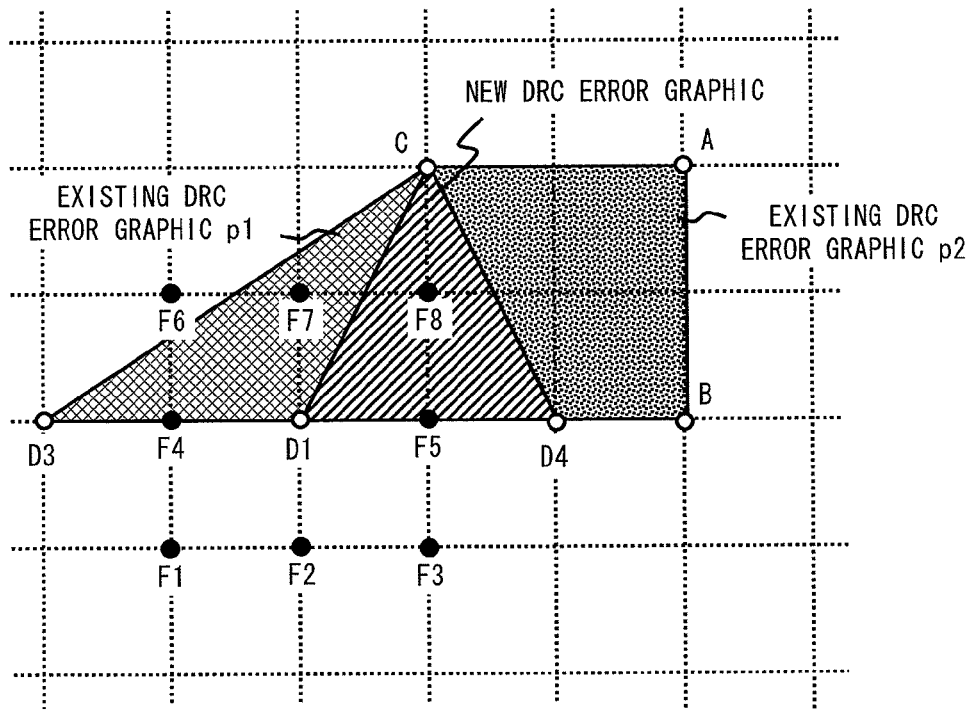
FIG. 10 is a diagram showing an example of an error graphic judged as non-equivalent in processing of equivalence judgment of the graphics according to the first exemplary embodiment.

Now, the example of the error graphic judged as non-equivalent as a result of judgment processing in step S35 will be described. FIG. 10 shows an example of the error graphic judged as non-equivalent. The new DRC error graphic of the error graphics shown in FIG. 10 is similar to the new DRC error graphic shown in FIG. 6. In the example shown in FIG. 10, existing DRC error graphics p1 and p2 are shown as the existing DRC error graphic that corresponds to the new DRC error graphic.

The vertices A to C of the existing DRC error graphic p1 match those of the new DRC error graphic, and the vertex D3 is located at a position different from the vertex D1 of the new DRC error graphic. At this time, the vertex D3 does not match any of the peripheral vertex coordinates F1 to F8. In other words, the vertex D3 exists in a range outside the range that is judged as equivalent to the vertex D1 (for example, equivalent range defined by the peripheral vertex coordinates F1 to F8). Thus, the existing DRC error graphic p1 and the new DRC error graphic are judged as non-equivalent.

The vertices A to C of the existing DRC error graphic p2 match those of the new DRC error graphic, and the vertex D4 is located at a position different from the vertex D1 of the new DRC error graphic. At this time, the vertex D4 does not match any one of the peripheral vertex coordinates F1 to F8. In other words, the vertex D4 exists in a range outside the range that is judged as equivalent to the vertex D1 (for example, equivalent range defined by the peripheral vertex coordinates F1 to F8). Thus, the existing DRC error graphic p2 and the new DRC error graphic are judged as non-equivalent.

As such, when it is judged in step S35 that the new DRC error graphic and the existing DRC error graphic are non-equivalent, the non-equivalent judgment result is output in step S38, and thereafter the processing of step S16 is terminated.

When it is judged by the processing of step S16 that the new DRC error graphic and the existing DRC error graphic are equivalent, according to the layout verification method of the first exemplary embodiment, the new DRC error graphic is not included in the verification result or removed from the verification result. In summary, only the new DRC error graphic where the new DRC error graphic and the existing DRC error graphic are judged as non-equivalent by the processing of step S16 is included in the verification result (processing of steps S17 and S18).

Figure 11:
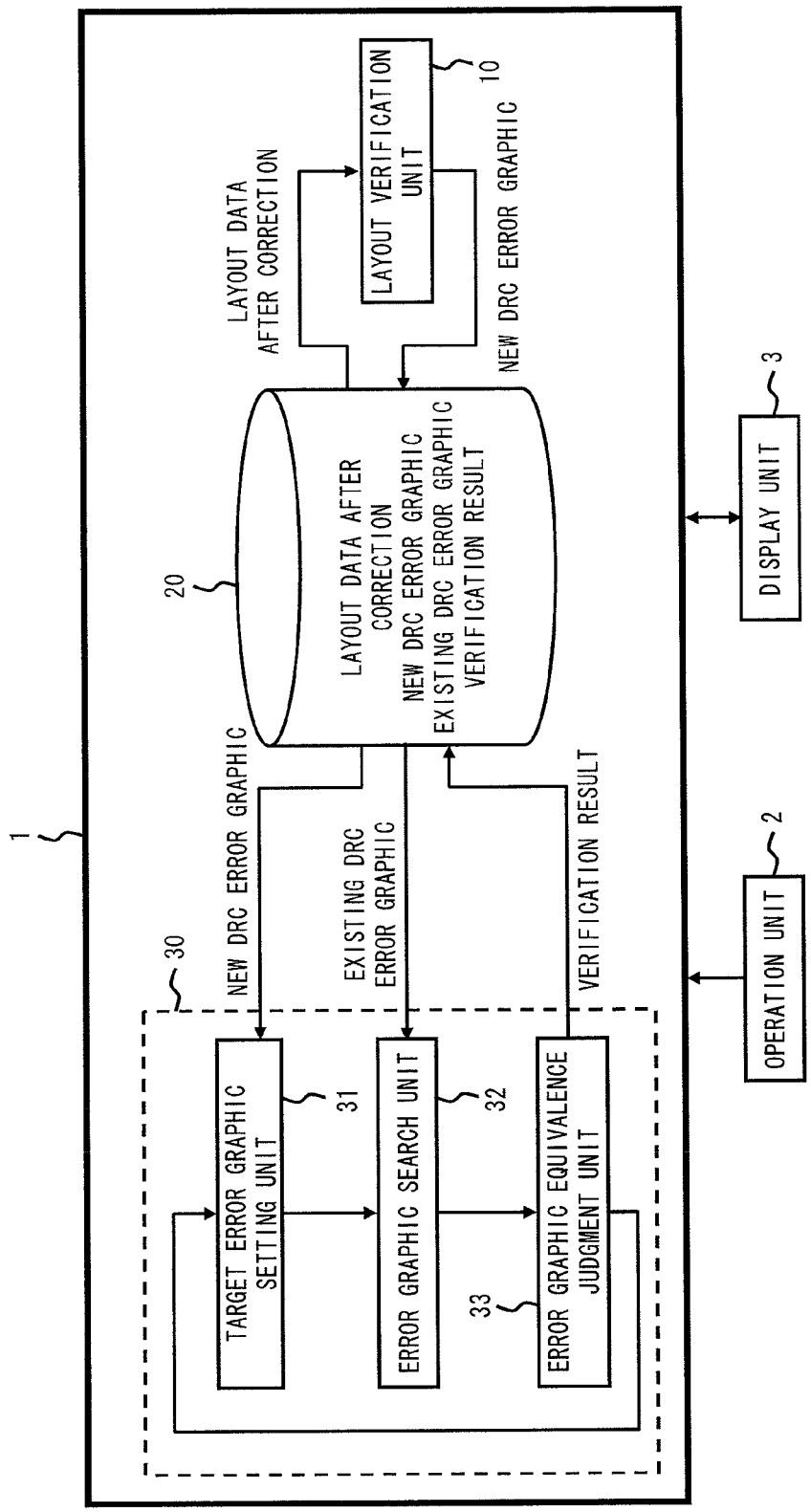
FIG. 11 is a block diagram of a layout verification device according to the first exemplary embodiment.

Although the layout verification method according to the first exemplary embodiment has been described in the above description, the hardware to implement the layout verification method described above will be described hereinafter in detail. FIG. 11 shows a block diagram of a layout verification device 1 to realize the layout verification method according to the first exemplary embodiment. As shown in FIG. 11, the layout verification device 1 includes a layout verification unit 10, a storage device 20, and an error graphic verification unit 30. Further, an operation unit 2 and a display unit 3 are connected to the layout verification device 1. The operation unit 2 includes a keyboard or a mouse to perform operation of the layout verification device 1. The display unit 3 is to display processing result executed in the layout verification device 1 or to display interface screen for operation. Note that the corrected layout pattern stored in the storage device 20 of the layout verification device 1 is created by a layout pattern creation device that is provided separately from the layout verification device 1. Further, the layout pattern creation device may be embedded in the layout verification device 1.

The layout verification unit 10 reads out the corrected layout pattern from the storage device 20, and performs DRC processing on the corrected layout pattern. Further, the layout verification unit 10 stores the new DRC error graphic generated by the DRC processing in the storage device 20. In summary, the layout verification unit 10 performs the processing corresponding to that of step S2 shown in FIG. 1.

The storage device 20 stores the corrected layout pattern, the new DRC error graphic, the existing DRC error graphic, and the verification result. The corrected layout pattern is input from the layout pattern creation device which is not shown. The new DRC error graphic is input from the layout verification unit 10. The existing DRC error graphic is input at a time when the layout verification unit 10 performs the DRC processing on the existing layout pattern. The verification result is input from the error graphic verification unit 30.

The error graphic verification unit 30 judges equivalence of the new DRC error graphic and the existing DRC error graphic. In summary, the error graphic verification unit 30 executes the processing of step S3 shown in FIG. 1. The error graphic verification unit 30 includes a target error graphic setting unit 31, an error graphic search unit 32, and an error graphic equivalence judgment unit 33.

The target error graphic setting unit 31 selects the new DRC error graphic which is the processing target, and specifies the position of the selected new DRC error graphic on the corrected layout pattern, so as to set the processing target area. In summary, the target error graphic setting unit 31 executes the processing of steps S11, S13, S14 shown in FIG. 2. At this time, the target error graphic setting unit 31 reads the new DRC error graphic from the storage device 20.

The error graphic search unit 32 searches the existing DRC error graphic included in the processing target area set by the target error graphic setting unit 31. In short, the error graphic search unit 32 performs the processing of steps S12 and S15 shown in FIG. 2. At this time, the error graphic search unit 32 reads the existing DRC error graphic.

The error graphic equivalence judgment unit 33 judges the equivalence of the new DRC error graphic and the existing DRC error graphic, and outputs the verification result to the storage device 20 based on the judgment result. In short, the error graphic equivalence judgment unit 33 performs the processing of steps S16 to S18.

As described above, the layout verification method of the first exemplary embodiment can be realized by providing the hardware to realize each process flow. Further, the layout verification method of the first exemplary embodiment can be realized with the software. The processing executed in the layout verification unit 10 and the error graphic verification unit 30 is defined as the layout verification program, and the layout verification program is executed in a calculation circuit such as a CPU or the like, so as to realize the layout verification method according to the first exemplary embodiment by the software. Note that the calculation circuit uses the storage device 20 as the storage device.

From the above description, in the layout verification device, the layout verification program, and the layout verification method according to the first exemplary embodiment, the equivalence of the new DRC error graphic and the existing DRC error graphic can be judged only by comparing the vertex coordinates of the error graphics in step S16 or the error graphic equivalence judgment unit 33. As such, in the layout verification device, the layout verification program, and the layout verification method, the equivalence of the graphics can be judged only with the processing of comparison processing that is completed in short time without performing the processing that requires large amount of time such as the processing of calculating the distance between vertices in the equivalence judgment processing of the graphic. Thus, the equivalence judgment processing of the graphic can be performed in short time in the layout verification device, the layout verification program, and the layout verification method.

Further, the time to analyze the layout verification result can be reduced by removing the new DRC error graphic that is judged as equivalent to the existing DRC error graphic from the search result. The DRC error graphic output as a result of the layout verification includes the one that has already been judged as the pseudo error. However, by employing the layout verification device, the layout verification program, and the layout verification method according to the first exemplary embodiment, it is possible to remove from the verification result the one that is judged as equivalent to the DRC error graphic where the analysis and the validity judgment have already been performed, whereby there is no need to perform the analysis and the validity judgment again.

Second Exemplary Embodiment

Figure 12:
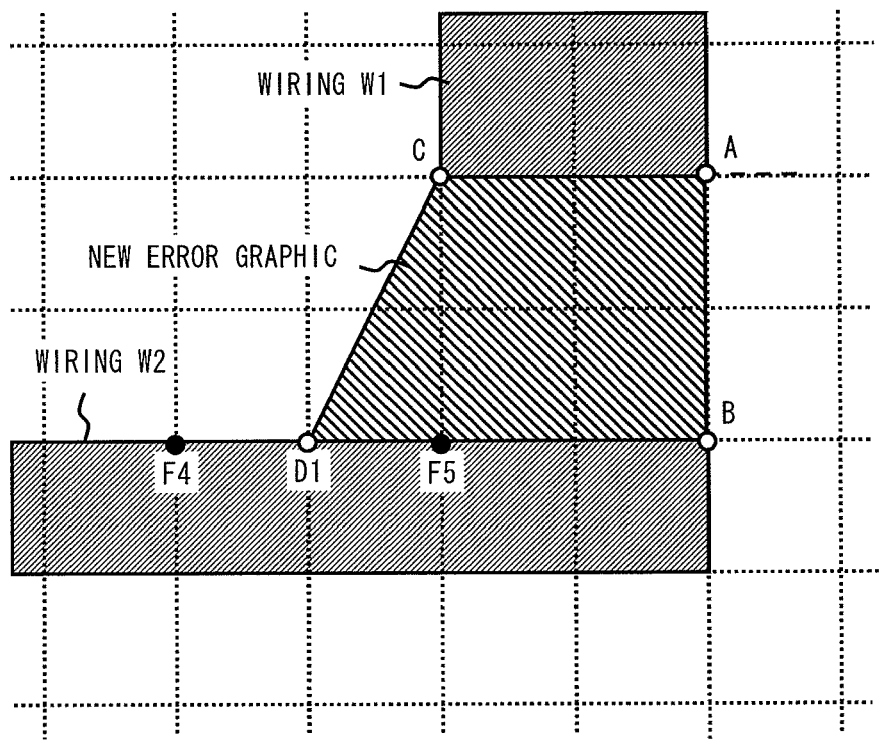
FIG. 12 is a schematic diagram of peripheral vertex coordinates set in processing of equivalence judgment of graphics according to the second exemplary embodiment.
Figure 13:
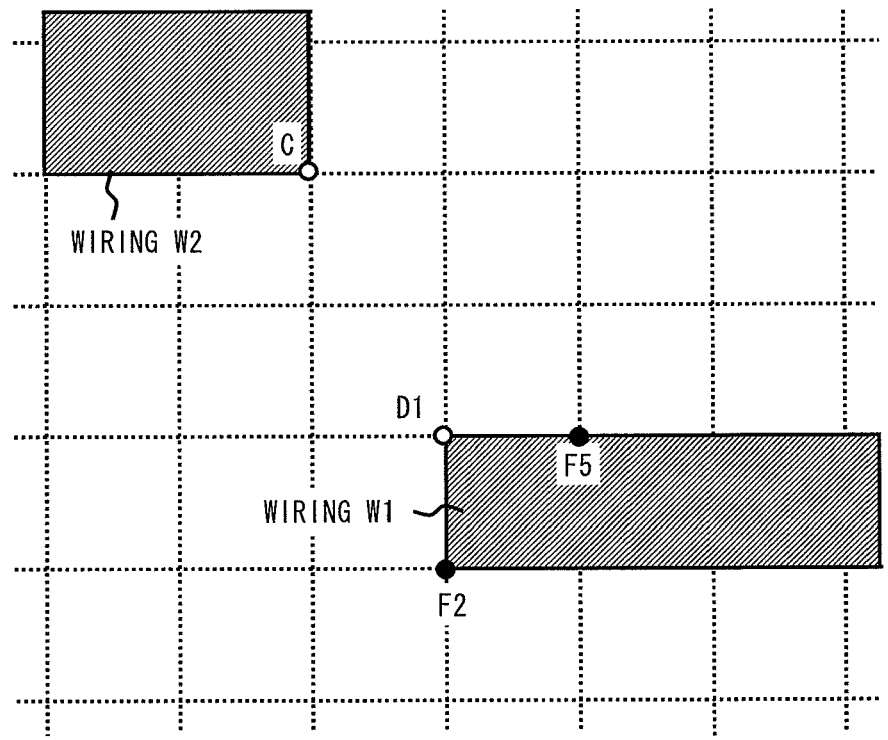
FIG. 13 is a schematic diagram of the peripheral vertex coordinates set in the processing of the equivalence judgment of the graphics according to the second exemplary embodiment.

In the second exemplary embodiment, a method of limiting the number of peripheral vertex coordinates that are the comparison target in step S35 shown in FIG. 4 to two is described. FIGS. 12 and 13 show schematic diagrams of the peripheral vertex coordinates set in the layout verification method of the second exemplary embodiment.

In the example shown in FIG. 12, the vertex D1 which is the target vertex coordinate in the new DRC error graphic is located on a side of the wiring W2. In such a case, the grid intersection where the vertex D1 may be deviated is limited to the side where the vertex D1 is located in the wiring W2. In the example shown in FIG. 12, only the peripheral vertex coordinates F4 and F5 that are set to the grid intersections on the side of the wiring W2 where the vertex D1 is located are comparison candidates.

Further, in the example shown in FIG. 13, the vertex D1 which is the target vertex coordinate in the new DRC error graphic is located at a corner of the wiring W1. In such a case, the grid intersection where the vertex D1 may be deviated is limited to the side of the wiring W1 extending in a vertical direction in FIG. 13 or to the side of the wiring W1 extending in a horizontal direction in FIG. 13. In the example shown in FIG. 13, only the peripheral vertex coordinates F2 and F5 set in the grid intersections on the side perpendicular at a corner of the wiring W1 where the vertex D1 is located are made to the comparison candidates.

By limiting the peripheral vertex coordinates that are the comparison candidates, time required to perform the setting processing of the peripheral vertex coordinates of step S34 and the coordinate comparison processing of step S35 may be reduced.

Third Exemplary Embodiment

Figure 14:
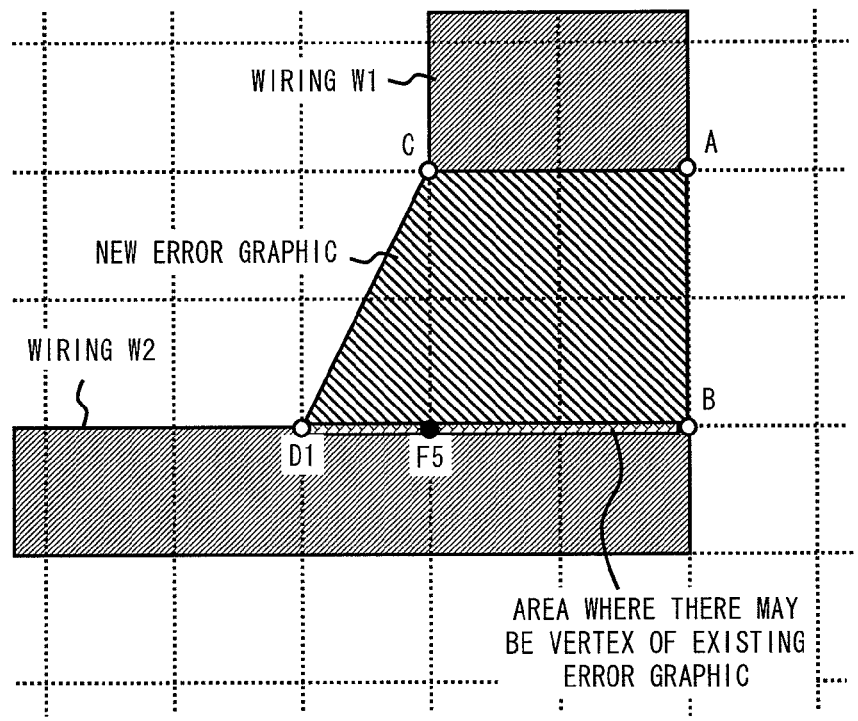
FIG. 14 is a schematic diagram of peripheral vertex coordinates set in processing of equivalence judgment of graphics according to a third exemplary embodiment.
Figure 15:
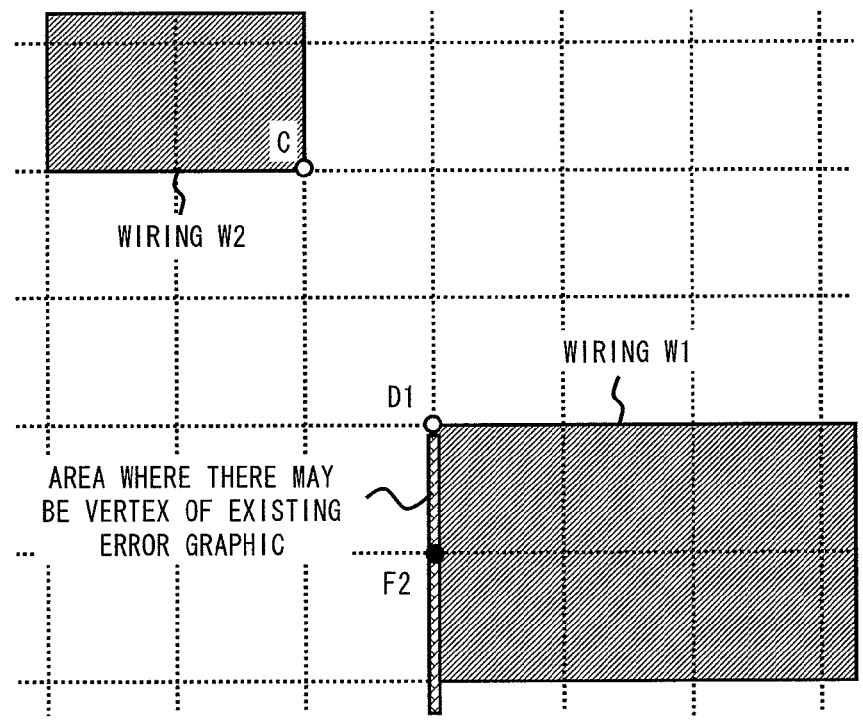
FIG. 15 is a schematic diagram of the peripheral vertex coordinates set in the processing of the equivalence judgment of the graphics according to the third exemplary embodiment.

In the third exemplary embodiment, a method of limiting the number of peripheral vertex coordinates that are comparison target in step S35 shown in FIG. 4 to one will be described. FIGS. 14 and 15 show schematic diagrams of the peripheral vertex coordinates set in the layout verification method of the third exemplary embodiment.

In the example shown in FIG. 14, the vertex D1 which is the target vertex coordinate in the new DRC error graphic is located on the side of the wiring W2. Further, in the example shown in FIG. 14, the vertex D2 corresponding to the vertex D1 in the existing DRC error graphic exists on the side that connects the vertex D1 and the vertex B in the wiring W2. Thus, the grid intersection where the vertex D1 may be deviated is limited to the side that connects the vertex D1 and the vertex B in the wiring W2. Thus, in the example shown in FIG. 14, only the peripheral vertex coordinate F5 set to the grid intersection on the side of the wiring W2 where the vertex D1 is located and in the vertex B side of the vertex D1 is set to the comparison candidate.

Further, in the example shown in FIG. 15, the vertex D1 which is the target vertex coordinate in the new DRC error graphic is located at a corner of the wiring W1. Further, in the example shown in FIG. 15, the vertex D2 corresponding to the vertex D1 in the existing DRC error graphic exists on the side of the wiring W1 that extends in the vertical direction in FIG.

15. In such a case, the grid intersection where the vertex D1 may be shifted is limited to the side of the wiring W1 extending in the vertical direction of FIG. 15. Thus, in the example shown in FIG. 15, only the peripheral vertex coordinate F2 set to the grid intersection on the side that is perpendicular at a corner of the wiring W1 where the vertex D1 is located is set to comparison candidate.

As described above, by limiting the peripheral vertex coordinate that is the comparison candidate, time required to perform setting processing of the peripheral vertex coordinate of step S34 and coordinate comparison processing of step S35 can be reduced.

Fourth Exemplary Embodiment

Figure 16:
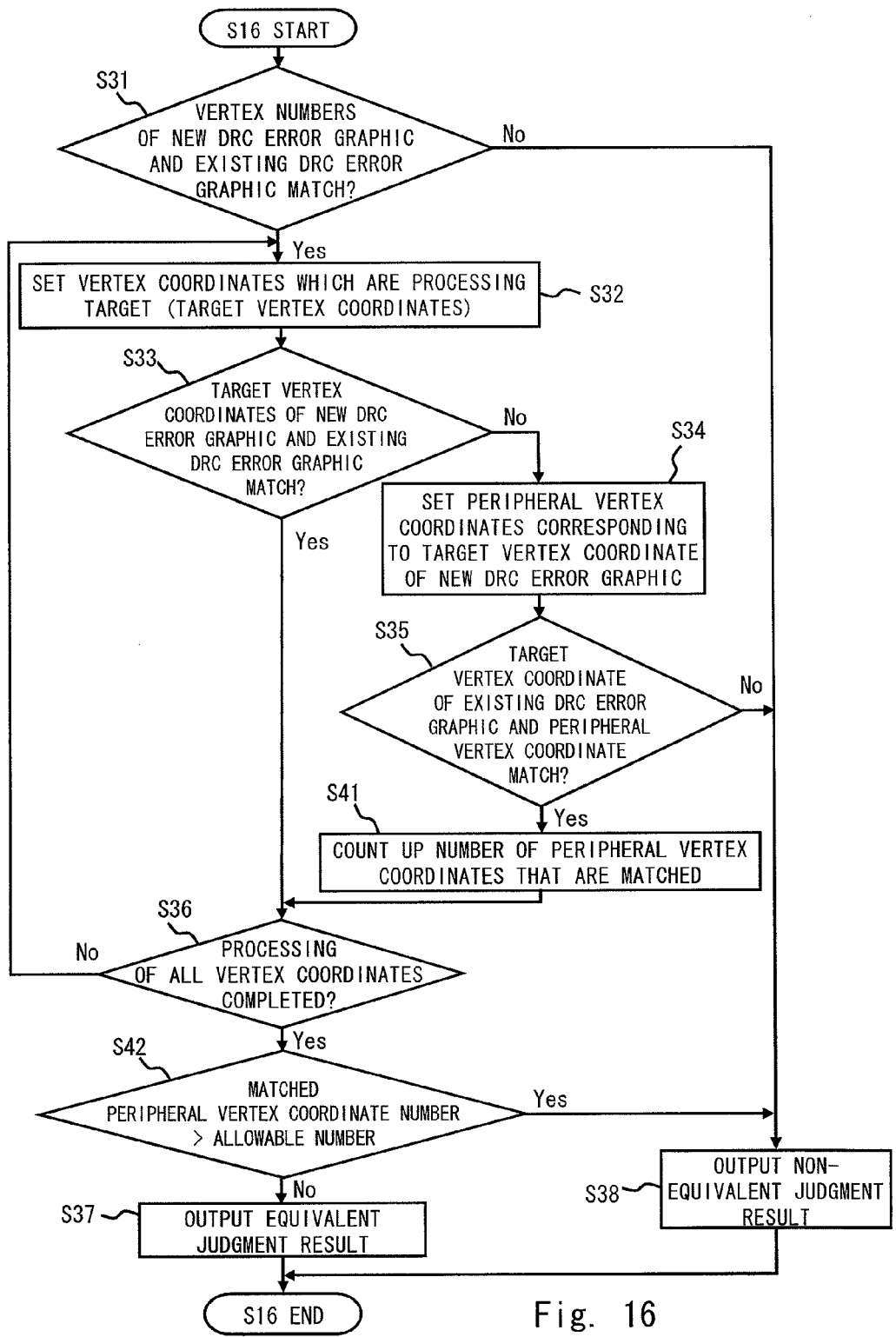
FIG. 16 is a flow chart showing processing of equivalence judgment of graphics according to a fourth exemplary embodiment.

In the fourth exemplary embodiment, an allowable number is added as the judgment condition in the judgment processing of equivalence of the graphics (processing of step S16 shown in FIG. 2). Now, FIG. 16 shows a process flow of the equivalence judgment according to the fourth exemplary embodiment. As shown in FIG. 16, in the process flow of the equivalence judgment according to the fourth exemplary embodiment, steps S41 and S42 are added to the process flow shown in FIG. 4.

Step S41 is performed between step S35 and step S36. In step S41, in accordance with the judgment that the target vertex coordinate of the existing DRC error graphic matches the peripheral vertex coordinate, the number of peripheral vertex coordinates that are matched is counted. By performing the processing of step S41 on all the vertex coordinates of the new DRC error graphic which is the processing target, the number of vertices in which deviation occurs between the new DRC error graphic and the existing DRC error graphic can be judged. Hereinafter, the number of vertices where there is a deviation is referred to as matched peripheral vertex coordinate number.

Step S42 is performed between step S36 and step S37. Step S42 compares the matched peripheral vertex coordinate number with the allowable number that is separately set. At this time, when the matched peripheral vertex coordinate number exceeds the allowable number, the process goes to Yes in step S42, and it is judged that the new DRC error graphic which is the processing target and the existing DRC error graphic are non-equivalent. On the other hand, when the matched peripheral vertex coordinate number is equal to or less than the allowable number, the process goes to No in step S42, and it is judged that the new DRC error graphic which is the processing target and the existing DRC error graphic are equivalent.

Figure 17:
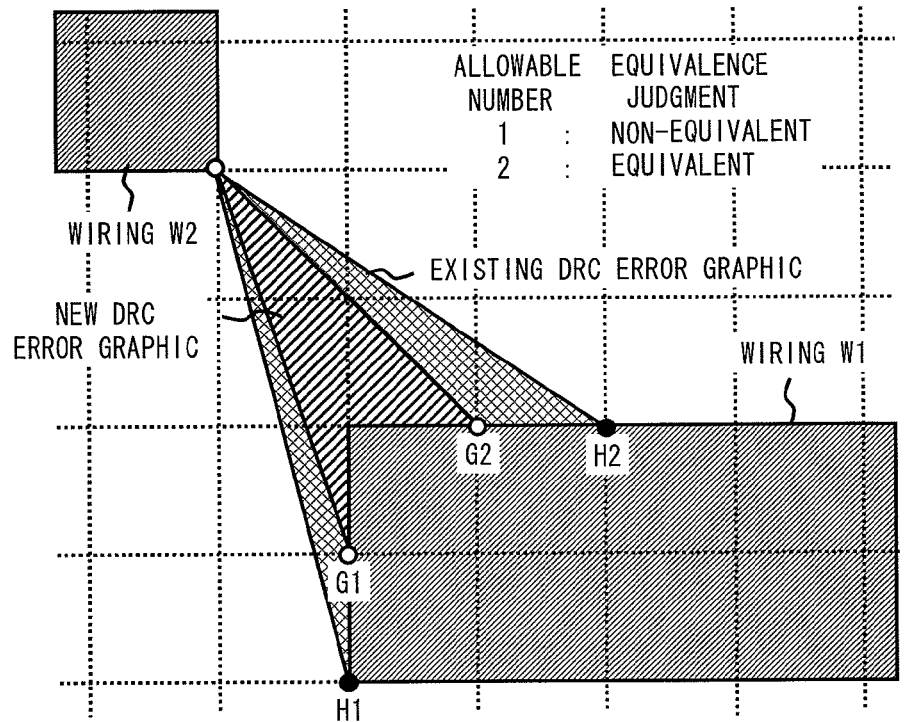
FIG. 17 is a diagram showing an example of error graphics that are judgment target in the processing of the equivalence judgment of the graphics according to the fourth exemplary embodiment.

Now, the specific example when the equivalence judgment process flow according to the fourth exemplary embodiment is applied will be described. Now, FIG. 17 shows a layout pattern example where there are two deviations of the vertices. In the layout pattern example shown in FIG. 17, the new DRC error graphic matches the existing DRC error graphic by shifting a vertex G1 of the new DRC error graphic to a vertex H1 and shifting a vertex G2 of the new DRC error graphic to a vertex H2. Thus, in the example shown in FIG. 17, the matched peripheral vertex coordinate number is 2. At this time, when the allowable number is set to 1, the matched peripheral vertex coordinate number becomes larger than the allowable number. Thus, in the fourth exemplary embodiment, the two error graphics shown in FIG. 17 are judged as non-equivalent. On the other hand, when the allowable number is set to 2, the matched peripheral vertex coordinate number is equal to the allowable number, and thus, the two error graphics shown in FIG. 17 are judged as equivalent in the fourth exemplary embodiment.

Figure 18:
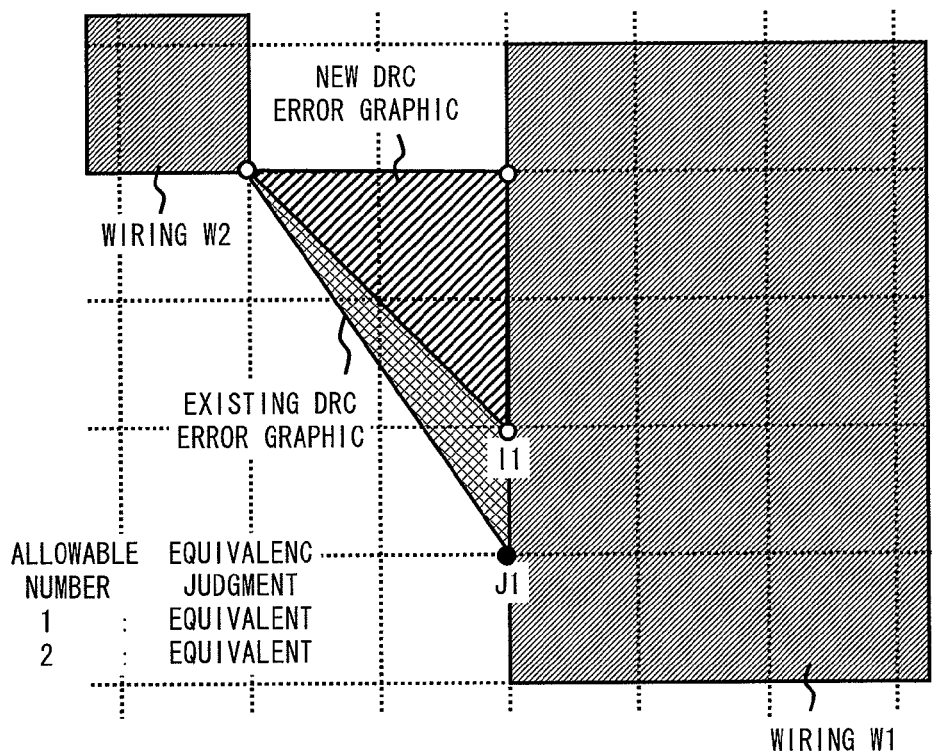
FIG. 18 is a diagram showing an example of the error graphics that are the judgment target in the processing of the equivalence judgment of the graphics according to the fourth exemplary embodiment.
Figure 19:
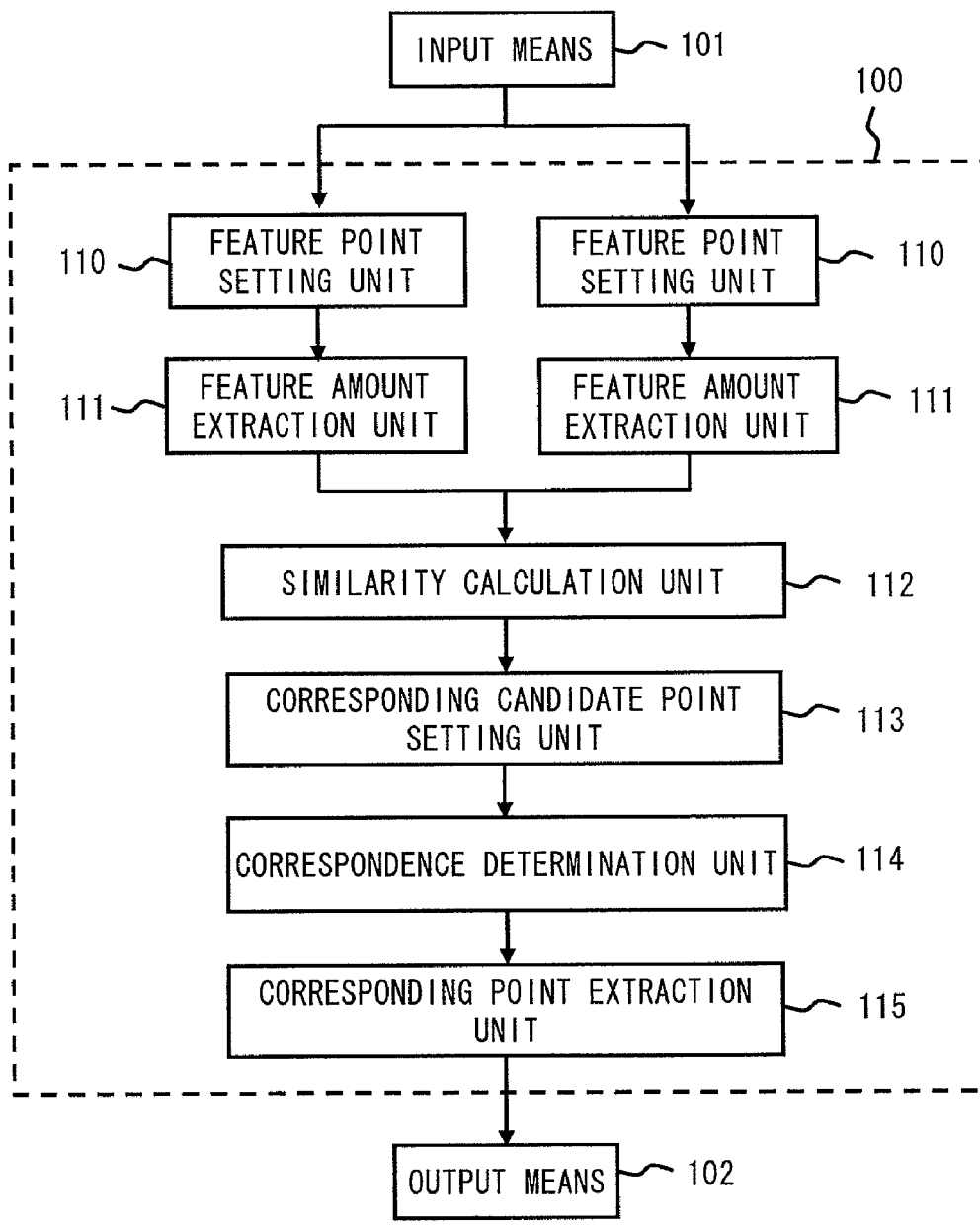
FIG. 19 is a block diagram of a pattern extracting device disclosed in Japanese Unexamined Patent Application Publication No. 11-110542.
Figure 20:
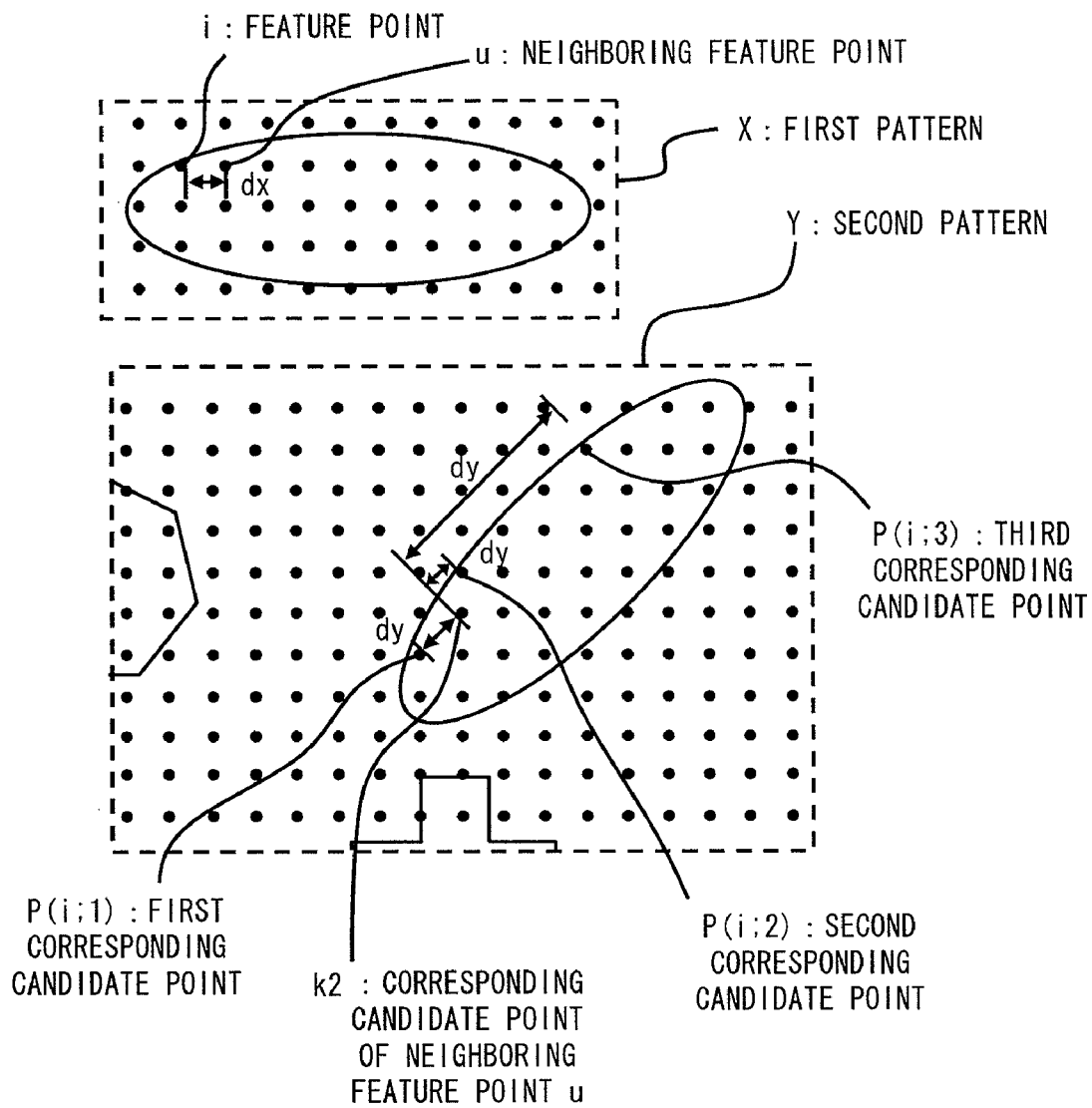
FIG. 20 is a schematic diagram of a graphic processed in the pattern extracting device disclosed in Japanese Unexamined Patent Application Publication No. 11-110542.

Further, FIG. 18 shows a layout pattern example where one vertex is deviated. In the layout pattern example shown in FIG. 18, a vertex I1 of the new DRC error graphic is shifted to a vertex J1, so that the new DRC error graphic matches the existing DRC error graphic. Thus, in the example shown in FIG. 18, the matched peripheral vertex coordinate number becomes 1. At this time, when the allowable number is set to 1, the matched peripheral vertex coordinate number is equal to the allowable number. Thus, in the fourth exemplary embodiment, two error graphics shown in FIG. 18 are judged as equivalent. Further, when the allowable number is set to 2, the matched peripheral vertex coordinate number becomes smaller than the allowable number. Thus, in the fourth exemplary embodiment, two error graphics shown in FIG. 18 are judged as equivalent.

In the first to third exemplary embodiments, two graphics are judged as equivalent regardless of the number of vertices where the deviation occurs if the deviation is within the neighboring grid intersections. Thus, according to the first to third exemplary embodiments, even when the vertices of the new DRC error graphic and the existing DRC error graphic are totally different, these two graphics are judged as equivalent to remove the real error graphic from the verification target. However, the new DRC error graphic where a large number of vertices are deviated may be output due to the cause different from the existing DRC error graphic. Thus, if such a graphic is removed from the verification target, the error cannot be detected.

However, in the layout verification method according to the fourth exemplary embodiment, it is possible to judge the new DRC error graphic where the number of vertices that are deviated is larger than the allowable number as the non-equivalent graphic. Thus, according to the layout verification method of the fourth exemplary embodiment, there is a low possibility that the new DRC error graphic is falsely deleted compared with the first to third exemplary embodiments, thereby improving the accuracy of the layout verification. Further, the new DRC error graphic where the number of vertices that are deviated is small is judged as equivalent to the existing DRC error graphic, and may be removed from the verification result.

Note that the present invention is not limited to the above-described exemplary embodiments, but can be changed in various ways without departing from the spirit of the present invention.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above. Furthermore, it is noted that, Applicant's intent is to encompass equivalents of all claim elements, even if amended later during prosecution.

What is claimed is:
1. A layout verification device that includes a layout verification unit, the layout verification unit verifying consistency of a first layout pattern where vertices are arranged along with grid intersections and a design rule and outputting a first error graphic corresponding to a position judged as inconsistent, the layout verification device comprising:

a target error graphic setting unit that specifies a location of the first error graphic in the first layout pattern, and sets a processing target area including the first error graphic;

an error graphic search unit that searches a second error graphic located in an area corresponding to a processing target area of a second layout pattern where a verification of consistency by the layout verification unit has already been performed; and an error graphic equivalence judgment unit that compares a plurality of vertex coordinates of the first error graphic with a plurality of vertex coordinates of the second error graphic to verify equivalence of the second error graphic and the first error graphic, wherein the error graphic equivalence judgment unit sets vertices having different coordinates between the first error graphic and the second error graphic as a first target vertex coordinate and a second target vertex coordinate, respectively, and judges that the first error graphic and the second error graphic are non-equivalent when the second target vertex coordinate does not match any one of a plurality of peripheral vertex coordinates set in grid intersections that are adjacent to the first target vertex coordinate.

2. The layout verification device according to claim 1, wherein the error graphic equivalence judgment unit outputs the first error graphic which is judged as non-equivalent as a verification result.

3. The layout verification device according to claim 1, wherein the error graphic equivalence judgment unit compares the second target vertex coordinate with a peripheral vertex coordinate which is in the same side as the first target vertex coordinate among the plurality of peripheral vertex coordinates.

4. The layout verification device according to claim 1, wherein the error graphic equivalence judgment unit compares the second target vertex coordinate with a similar vertex coordinate which is in a side where the first target vertex coordinate and the second target vertex coordinate exist among the plurality of peripheral vertex coordinates.

5. The layout verification device according to claim 1, wherein the error graphic equivalence judgment unit judges that the first error graphic and the second error graphic are non-equivalent when a number of first target vertex coordinates that match a vertex coordinate of the second error graphic as a result of shifting a vertex coordinate of the first error graphic to the peripheral vertex coordinate exceeds an allowable number of grids that is set in advance.

6. The layout verification device according to claim 1, wherein the error graphic equivalence judgment unit judges that the first error graphic and the second error graphic are non-equivalent when a number of vertices of the first error graphic does not match a number of vertices of the second error graphic.

7. The layout verification device according to claim 1, wherein the layout verification unit performs the verification of the consistency regardless of intervals of the grid intersections, and outputs the first error graphic including vertex coordinates in the grid intersections based on a result of the verification of the consistency.

8. A layout verification program that is executed in a calculation circuit to cause the calculation circuit to verify equivalence of a first error graphic and a second error graphic, the first error graphic being obtained by verifying consistency of a first layout pattern where vertices are arranged along with grid intersections and a design rule, the second error graphic being obtained from a second layout pattern where layout verification has already been performed, the layout verification program comprising instructions for:

reading the first error graphic from a storage device;

setting a processing target area including the first error graphic;

reading the second error graphic from the storage device;

searching the second error graphic located in an area corresponding to a processing target area of the second error graphic; and setting vertices having different coordinates between the first error graphic and the second error graphic as a first target vertex coordinate and a second target vertex coordinate, respectively, and performing equivalence judgment of graphics by judging that the first error graphic and the second error graphic are non-equivalent when the second target vertex coordinate does not match any one of a plurality of peripheral vertex coordinates set in grid intersections that are adjacent to the first target vertex coordinate.

9. The layout verification program according to claim 8, wherein the layout verification program outputs the first error graphic that is judged as non-equivalent to the storage device as a verification result.

10. The layout verification program according to claim 8, wherein the second target vertex coordinate and a peripheral vertex coordinate which is in the same side as the first target vertex coordinate among the plurality of peripheral vertex coordinates are compared in the equivalence judgment of graphics.

11. The layout verification program according to claim 8, wherein the second target vertex coordinate and a similar vertex coordinate which is in a side where the second target vertex coordinate and the first target vertex coordinate exist among the plurality of peripheral vertex coordinates are compared in the equivalence judgment of graphics.

12. The layout verification program according to claim 8, wherein the first error graphic and the second error graphic are judged as non-equivalent in the equivalence judgment of graphics when a number of first target vertex coordinates that match a vertex coordinate of the second error graphic as a result of shifting a vertex coordinate of the first error graphic to the peripheral vertex coordinate exceeds an allowable number of grids that is set in advance.

13. The layout verification program according to claim 8, wherein the first and second error graphics include the target vertex coordinates in the grid intersections.

* * * * *